US005500534A

United States Patent [19]
Robinson et al.

[11] Patent Number: 5,500,534
[45] Date of Patent: Mar. 19, 1996

[54] INTEGRATED ENERGY-SENSITIVE AND POSITION-SENSITIVE X-RAY DETECTION SYSTEM

[75] Inventors: Douglas S. Robinson; Terrence C. Jensen; Joseph N. Gray, all of Ames, Iowa

[73] Assignee: Iowa State University Research Foundation, Ames, Iowa

[21] Appl. No.: 220,913

[22] Filed: Mar. 31, 1994

[51] Int. Cl.⁶ .................................................. G01T 1/185
[52] U.S. Cl. ...................................... 250/385.1; 250/374
[58] Field of Search .............................. 250/374, 385.1

[56] References Cited

U.S. PATENT DOCUMENTS

| | | | |
|---|---|---|---|
| 4,769,547 | 9/1988 | Uber, III | 250/374 |
| 4,804,847 | 2/1989 | Uber, III | 250/374 X |

FOREIGN PATENT DOCUMENTS 2602058  1/1988  France .

OTHER PUBLICATIONS

T. Tanimori et al., "Gamma-Ray Detectors," SPIE vol. 1734, pp. 68–74 (1992).
F. Angelini et al. "A microstrip gas chamber on a silicon substrate," Nuclear Instruments and Methods in Physics Research, A314, pp. 450–454 (1992).
Biagi et al., "Initial investigations of the performance of a microstrip gas–avalanche chamber fabricated on a thin silicon–dioxide substrate," Nuclear Instruments and Methods in Physics Research, A323, pp. 258–262 (1992).
Barasch et al., "Gas Microstrip Detectors on Polymer, Silicon and Glass substrates," Nuclear Physics II (Proc. Suppl.) vol. 32, pp. 216–222 (1993).
Angelini et al., "The micro–gap chamber," Nuclear Instruments and Methods in Physics Research, A335, pp. 69–77 (1993).
C. Budtz–Jorgensen, "Features of the microstrip proportional counter technology (invited)," Rev. Sci. Instrum., vol. 63, No. 1, pp. 648–654 (Jan. 1992).
Minakov et al., "Performance of gas microstrip chambers on glass with ionic and electronic conductivity," Nuclear Instruments and Methods in Physics Research, A326, pp. 566–569 (1993).
J. Richter, "Large size microstrip particle detectors," Nuclear Instruments and Methods in Physics Research, A323, pp. 263–265 (1993).
Barbosa et al., "Two dimensional X-ray detector based on microstrip and multiwire design," Nuclear Instruments and Methods in Physics Research, A323, pp. 247–251 (1992).
Bouclier et al, "High flux operation of microstrip gas chambers on glass and plastic supports," Nuclear Instruments and Methods in Physics Research, A323, pp. 240–246 (1992).
Nagae et al., "Development of microstrip gas chambers with multi-chip technology," Nuclear Instruments and Methods in Physics Research, A323, pp. 236–329 (1992).
Angelini et al., "A Microstrip Gas Avalanche Chamber with Two–Dimensional Readout," Nuclear Instruments and Methods in Physics Research, A283, pp. 755–761 (1989).
F. Hartjes et al., "A Prototype Microstrip Gas Detector," Nuclear Instruments and Methods in Research, A289, pp. 384–387, (1990).

(List continued on next page.)

*Primary Examiner*—Carolyn E. Fields
*Assistant Examiner*—Edward J. Glick
*Attorney, Agent, or Firm*—Mark L. Fleshner

[57] ABSTRACT

An integrated x-ray detection system includes an x-ray detector fabricated on a wafer with a housing for containing a gas. The detector has a plurality of microstrip anodes and the housing passes x-rays which partially ionize the gas thereby producing a pulse at one of the anodes. The same wafer also has a plurality of integrated active signal processing circuits which are respectively coupled to the anodes. Each active signal processing circuit receives and processes pulses from respective ones of the anodes and outputs a digital signal indicating the location and energy of x-rays detected by the detector. An isolation layer separates the x-ray detector from the active signal processing circuits.

31 Claims, 11 Drawing Sheets

OTHER PUBLICATIONS

Budtz–Jorgensen et al., "X–ray imaging with the XPECT/SODART microstrip proportional counters," X–Ray and Gamma Ray–Instrumentation for Astronomy III, SPIE vol. 1743 EUV, pp. 162–173 (1992).

Fulton et al., "Microstrip proportional counter development at MSFC," X–Ray and Gamma–Ray Instrumentation for Astronomy III, SPIE vol. 1743 EUV, pp. 125–132 (1992).

B. D. Ramsey, "The Microstrip Proportional Counter," X–Ray and Gamma–Ray Instrumentation for Astronomy III, SPIE vol. 1743 EUV, pp. 96–103 (1992).

Oed et al., "Substratum and layout parameters for microstrip anodes in Gas Detectors," Nuclear Instruments and Methods in Physics Research, A310, pp. 95–97 (1991).

Hartjes et al., "Operation of the microstrip gas detector," Nuclear Instruments and Methods in Physics Research, A310, pp. 88–94 (1991).

Stahl et al., "First steps towards a foil microstrip chamber," Nuclear Instruments and Methods in Physics Research, A297, pp. 95–102, (1990).

A. Oed, "Position–Sensitive Detectors with Microstrip Anode for Electron Multiplication with Gases," Nuclear Instruments and Methods in Physics Research, A263, pp. 351–359 (1988).

A. Angelini et al., "A Microstrip Avalanche Chamber With Two Stages of Gas Amplification," Nuclear Instruments and Methods in Physics Research, A292, pp. 199–200 (1990).

Angelini et al., "The Microstrip Gas Avalanche Chamber: A New Detector for the Next Generation of High Luminosity Machines," CERN, Geneva–Switzerland, pp. 465–470, (no date).

Angelini et al., "A microstrip gas chamber with true two–dimensional and pixel readout," Nuclear Instruments and Methods in Physics Research, A323, pp. 229–235 (1992).

Angelini et al., "The Microstrip Gas Chamber," Nuclear Physics B (Proc. Suppl.) vol. 23A, pp. 254–260 (1991).

Oed et al., "A New Position Sensitive Proportional Counter with Microstrip Anode for Neutron Detection," Nuclear Instruments and Methods in Physics Research, A284, pp. 223–226 (1989).

Bouclier et al., "Microstrip Gas Chambers on Thin Plastic Supports," IEEE Transactions on Nuclear Science, vol. 39, No. 4, pp. 650–653 (1992).

Bouclier et al., "Performance of gas microstrip chambers on glass substrata with electronic conductivity," Nuclear Instruments and Methods in Physics Research, A332, pp. 100–106 (1993).

Schmidt et al., "Study of thin substrates for microstrip gas chambers," Nuclear Instruments and Methods in Physics Research, A337, pp. 382–386 (1994).

Pestov et al., "Influence on the bulk resistivity of glass with electronic conductivity on the performance of microstrip gas chamber," Nuclear Instruments and Methods in Physics Research, A338, pp. 368–374 (1994).

Savard et al., "An a–Si:H gas microstrip detector," Nuclear Instruments and Methods in Physics Research, A337, pp. 387–393 (1994).

Angelini et al., "A thin, large area microstrip gas chamber with strip and pad readout," Nuclear Instruments and Methods in Physics Research, A336, pp. 106–115 (1993).

Brons et al., "Use of ultra thin semiconductive layers as passivation in microstrip gas chambers," Nuclear Instrumentation and Methods in Physics Research, A342, pp. 411–415 (1994).

J. Moromisato et al., "The PC strip detector: towards a large scale gas microstrip counter," Nuclear Instruments and Methods in Physics Research, A345, pp. 90–94 (1994).

Breskin et al., "On the two–stage operation mechanism of low–pressure microstrip gas chambers," Nuclear Instruments and Methods in Physics Research, A345, pp. 205–209 (1994).

Schmidt et al., "Simulation of electrostatic properties and gas amplification in microstrip gas chambers and comparison with measurements," Nuclear Instruments and Methods in Physics Research, A344, pp. 558–570 (1994).

Florent et al., "The electrostatic field in microstrip chambers and its influence on detector performance," Nuclear Instruments and Methods in Physics Research, A329, pp. 125–132 (1993).

Jensen et al., "Application of a Microstrip Proportional Chamber to X–Ray Imaging," Review of Progress in Quantitative Nondestructive Evaluation, vol. 13, pp. 1135–1140 (1994).

Ting et al., "Using Energy Dispersive X–Ray Measurements for Quantitative Determination of Material Loss Due to Corrosion," Reivew of Progress in Quantitative Nondestructive Evaluation, vol. 12, pp. 1963–1969 (1993).

Charpak et al., "The Use of Multiwire Proportional Counters to Select and Localize Charged Particles," Nuclear Instruments and Methods, vol. 68, pp. 262–268 (1968).

Neumann et al., "Modification of the Charpak Chamber with Foil Supported Conductors," IEEE Trans. Nucl. Sci., NS17, vol. 43 (1970), pp. 43–48.

Budtz–Jorgensen et al., "Microstrip proportional counerrs for X–ray astronomy," Nuclear Instruments and Methods, A310, (1991), pp. 82–87.

INTEGRATED ENERGY-SENSITIVE AND POSITION-SENSITIVE X-RAY DETECTION SYSTEM

BACKGROUND OF THE INVENTION

1. Field of the Invention

This invention relates generally to a system for spatially detecting x-rays of varying wavelengths and in particular to an integrated x-ray detection system which can efficiently detect x-rays with energies in the range from approximately 1 keV to approximately 150 keV with an energy resolution as low as 0.5 keV or less and a spatial resolution of less than 100 micrometers.

2. Background of the Related Art

The defining characteristics of x-ray imaging technologies include spatial resolution, contrast sensitivity, speed, and cost. In addition, recently developed techniques for quantifying material composition require x-ray energy sensitivity. (See Ting et al., "Using Energy Dispersive X-ray Measurements for Quantitative Determination of Material Loss Due to Corrosion", in *Review of Progress in Quantitative Nondestructive Evaluation*, Vol. 12B, 1963, eds. D. O. Thompson and D. E. Chimenti, Plenum Press, New York (1993).) Many practical applications also require imaging under severe environmental conditions or in restricted spaces. Since no single x-ray detector offers optimum performance in all of the above areas, compromises must often be made.

X-ray detection technologies exhibiting energy sensitivity generally fall into two broad categories: wavelength dispersive systems or energy dispersive systems. In the former, Bragg diffraction from either a natural or artificial crystal is combined with collimating optics such that only those x-rays within an energy band determined by the geometry of the collimating optics and the lattice spacing of the diffracting crystal are allowed to impinge on an x-ray sensitive element. In such a system, the x-ray detector need not have any intrinsic energy sensitivity, since the collimating optics and crystal act as a filter and only allow certain wavelengths to reach the detector. Such wavelength dispersive systems generally have very limited throughputs both because the geometry of the incident x-ray optical system must be changed to allow detection of different energy photons, and because they are only a single pixel or point detection system.

Energy dispersive x-ray detection systems, on the other hand, generally rely on the photoelectric interaction between the incident quantum of radiation and a medium that results in the production of a number of charged particles in proportion to the energy of the incident photon. When the medium is a semiconductor such as silicon, germanium, or cadmium telluride, the electrons and holes generated by the interaction can be collected, and the amount of charge is a direct measure of the energy given up by the incident photon. Alternatively, the medium may be a gas that is ionized by the radiation such as in a gas proportional tube. Because energy dispersive detectors are intrinsically capable of distinguishing different wavelength photons, they are capable of rapid throughput. In addition, if the interaction medium is compartmentalized in some fashion, these detectors can be made to have many simultaneously active pixels, further improving the throughput of the system.

Gas proportional counters have been used for many years to detect ionizing radiation. Familiar Geiger counters are a close relative of this detector. In its simplest form, proportional counter 102 consists of a cylindrical outer cathode 110 with a small diameter anode wire 114 along axis A as shown in FIG. 1A. FIG. 1B shows a cross-sectional view of proportional counter 102. Volume B is typically filled with a gas 118 such as argon or xenon plus a few percent of a quenching gas such as methane. Electrons liberated by interaction of an x-ray or charged particle in gas 118 are driven toward anode 114 by an electric field. The electric field is produced when a voltage is applied by power supply 122 with leads 126a and 126b connected to cathode 110 and anode 114, respectively. Near anode 114, this electric field varies as $1/r$, where r is the distance from the center, as shown in FIG. 1A. The electric field must be strong enough such that electrons are accelerated to energies sufficient to ionize the gas molecules, thus generating an avalanche of electrons between anode 114 and cathode 110. The multiplicative gain in this process depends on the properties of the gas 118, the diameter d of anode 114, and the high voltage potential between anode 114 and cathode 110. This gain can be as high as $10^6$. Anode 114 is typically connected to electronic circuitry 150 to amplify and digitize the signal. A pulse of height h is produced at anode 114, where h is proportional to the number of electrons initially liberated in the interaction with the gas 118. The number of electrons liberated in this initial interaction between the quantum of ionizing radiation and the gas 118 is in turn proportional to the energy of the incident quantum of radiation. This is why counter 102 is referred to as a "proportional counter".

Counter 102, however, has a drawback for x-ray imaging in that it provides very little spatial information. In 1968, Charpak improved on this with the introduction of a multiwire proportional chamber. (See G. Charpak et at., "The Use of Multiwire Proportional Counters to Select and Localize Charged Particles", Nucl. Instrum. Methods 62, 262 (1968).) In that device, many parallel anode wires are positioned in a common gas volume. Each anode wire behaves as a proportional counter and can be connected to a separate electronic circuit to give position information. The spatial resolution, however, of these multiwire proportional chambers is limited because the wires cannot be placed closer than about 1 millimeter apart without becoming unstable. Such multiwire proportional chambers are also quite fragile, which has limited their use even more.

A new technology related to multiwire proportional chambers which offers promise in improving both spatial resolution and mechanical ruggedness is the microstrip proportional chamber. (See A. Oed, "Position-Sensitive Detector with Microstrip Anode for Electron Multiplication with Gases", Nucl. Instrum. Methods, A263, 351 (1988).) This device has been developed for research in astrophysics and high-energy physics. Its properties make it an attractive choice for x-ray imaging applications. It is conceptually similar to a multiwire proportional counter, but instead of parallel anode wires stretched across a gas volume, the anodes are fabricated by patterning a thin metal layer which adheres to a solid substrate. The solid supporting substrate allows both narrower anodes and closer spacing of the anodes than is possible with freely suspended wires. In addition, the adherence of the metal anodes to a solid insulating substrate prevents mechanical vibration and shock from causing relative movement and consequent short-circuiting of the anodes, thus greatly improving reliability.

While several research groups have tested many different substrate materials for fabrication of microstrip gas proportional chambers, we know of only three groups that have explored the use of silicon. The first group (See F. Angelini, et at., "A microstrip gas chamber on a silicon substrate", Nucl. Instrum. Methods, A314, 450, (1992).) used a low resistivity (i.e., heavily doped) silicon substrate with a thermally grown oxide layer for electrical isolation of the anodes and a conductive contact to the back of the silicon. In this implementation, the silicon is a conductor and is used as one of the electrodes of the chamber. This heavy doping renders the silicon useless for active device fabrication. The second group. (See S. F. Biagi, et al., "Initial investigations of the performance of a microstrip gas-avalanche chamber fabricated on a thin silicon-dioxide substrate", Nucl. Instrum. Methods, A323, 258, (1993).) did not indicate the resistivity of their substrate, but used a combination of thermal oxidation and plasma enhanced chemical vapor deposition to build an insulating layer for the anodes and placed the silicon substrate between sets of electrodes that must be held at high voltages during operation. The high fields from the electrodes can easily deplete the silicon and render any active devices fabricated in the silicon useless. The third group (See E. F. Barasch, et al., "Gas Microstrip Detectors on Polymer, Silicon and Glass substrates", Nuclear Physics B (Proc. Suppl.) 32, 216, (1993).) used anisotropic etching of the silicon substrate to etch pedestals to support the anodes and oxidation of the resulting silicon surface to provide electrical isolation of the anodes. Depletion by the electric fields from the electrodes will inhibit active device function. In addition, the etched pedestals are incompatible with the planar fabrication techniques needed to build active devices.

SUMMARY OF THE INVENTION

An object, therefore, of the invention is to provide an integrated x-ray detection system capable of simultaneously providing spatial resolution of detected x-rays and digitized energy resolution data for said x-rays at high throughput rates.

Another object of the invention is to provide an integrated x-ray detection system which is compact and rugged.

Another object of the invention is to provide an integrated x-ray detection system which can be used in digital radiography and computed tomography.

Another object of the invention is to provide an integrated x-ray detection system which allows a user to selectively detect x-rays with energies from specific portions of the incident spectrum by setting lower and upper energy limits for a small number of independent energy intervals or windows.

One advantage of the invention is that it is capable of simultaneously spatially detecting x-rays and distinguishing various x-ray energies.

Another advantage of the invention is that all of its processing circuitry and its x-ray detector can be fabricated on a single wafer or substrate.

Another advantage of the invention is that it enables high speed detection of both energy and position of x-rays.

Another advantage of the invention is that it eliminates the need for a large number of discrete wires and cables connecting x-ray sensitive elements to their associated electronics.

Another advantage of the invention is that it is less susceptible to noise pickup than systems constructed using discrete components and interconnecting cables.

Another advantage of the invention is that it is more reliable and rugged than wired systems.

Another advantage of the invention is that it can be used in digital radiography, computed tomography, monitoring and inspecting of composite materials, airline baggage inspection, corrosion detection, and x-ray detection in diffraction and scattering systems, all of which require spatial detection of x-rays and all of which benefit from energy sensitivity.

One feature of the invention is that it has metallic potential strips patterned onto a substrate or wafer.

Another feature of the invention is that it has multiple microstrip anodes patterned onto the substrate.

Another feature of the invention is that it has active signal processing circuits integrated into the substrate.

Another feature of the invention is that it has a wafer isolation layer above the active signal processing circuits to protect and electrically insulate those circuits from high voltages.

Another feature of the invention is that it has a metallic shield plane between the portions of the x-ray detector with high voltages and the active signal processing circuits to shield those circuits from stray electric fields.

Another feature of the invention is that it involves fabricating the x-ray detector by spin casting polyimide resin layers and curing them at temperatures sufficiently low that the circuits integrated in the substrate are not damaged.

Another feature of the invention is that it has active signal processing electronics including analog and digital circuits.

Another feature of the invention is that each analog circuit for each microstrip anode includes a protection circuit which reduces the potential for damage to the rest of the analog electronics.

Another feature of the invention is that each analog circuit for each microstrip anode includes a pulse shaper which improves the count rate capability of each anode.

Another feature of the invention is that it includes a plurality of energy window circuits following each amplifier circuit for each microstrip anode, wherein these energy window circuits detect pulses within a user specified range and convert said pulses to logic pulses.

Another feature of the invention is that each microstrip anode has digital circuits coupled to its analog circuits and these digital circuits include digital counters, each coupled to a respective energy window circuit in the analog circuits.

Another feature of the invention is that each digital circuit for each microstrip anode is coupled to an internal digital I/O bus which is in turn coupled via an I/O control logic circuit to an external digital interface circuit.

The above and other objects, advantages and features are accomplished by the provision of an integrated apparatus, comprising: a wafer; an x-ray detector fabricated on the wafer having a housing, a plurality of anodes and a gas contained in the housing, wherein at least a portion of the housing passes x-ray photons which partially ionize the gas thereby producing at least one pulse at one of the plurality of anodes; a plurality of active signal processing circuits integrated into the wafer and respectively coupled to the plurality of anodes, wherein a respective one of the plurality of signal processing circuits receives and processes the at least one pulse to yield a digital signal indicating location of the one of the plurality of anodes and amplitude of the pulse; and an electrically isolating layer for electrically isolating the x-ray detector from the plurality of active signal processing circuits.

The above and other objects, advantages and features of the invention are further accomplished when the plurality of active signal processing circuits comprise a respective plurality of analog circuits coupled to the plurality of anodes and a respective plurality of digital circuits coupled to the plurality of analog circuits, wherein the plurality of analog circuits comprise: a plurality of protection circuits respectively coupled to the plurality of anodes for pulses from the plurality of anodes and for protecting electronic circuits downstream from the anodes; a plurality of amplifiers respectively coupled to the plurality of protection circuits for receiving the pulses and amplifying the pulses to yield amplified pulses; and a plurality of pulse shapers respectively coupled to the plurality of amplifiers for receiving the amplified pulses and outputting shaped pulses, and wherein each of the plurality of digital circuits comprises: a plurality of multiple energy window circuits each of the multiple energy window circuits respectively coupled to the plurality of pulse shapers for receiving the shaped pulses and outputting digital logic pulses when the shaped pulses have amplitudes within an externally selected range; and a plurality of multiple digital counters respectively coupled to the plurality of multiple energy window circuits for receiving and counting the digital logic pulses.

The above and other objects, advantages and features are accomplished by the provision of an integrated x-ray detection system, comprising: a wafer capable of supporting integrated circuitry; a housing for housing the wafer and a gas, wherein at least a portion of the housing passes x-ray photons which partially ionize the gas thereby producing at least one electron; a plurality of anodes fabricated on the wafer, the plurality of anodes being maintained at a first potential; a plurality of potential strips alternately arranged among the plurality of anodes on the wafer and maintained at a second potential; a cathode plane arranged along the wafer and maintained at a third potential; a back potential plane fabricated on the wafer and maintained at a fourth potential, wherein the first, second, third and fourth potentials are selected such that the at least one electron is accelerated toward one of the plurality of anodes with sufficient energy to produce a pulse at the one of the plurality of anodes; a plurality of active signal processing circuits integrated into the wafer and respectively coupled to the plurality of anodes wherein a respective one of the plurality of signal processing circuits receives and processes the pulse to yield a digital signal indicating location of the one of the plurality of anodes and height of the pulse; and an insulation layer for separating the plurality of anodes, the plurality of potential strips and the back potential plane from the active signal processing circuit.

The above and other objects, advantages and features will become more apparent from the following description of embodiments thereof, taken in conjunction with the accompanying drawings.

DETAILED DESCRIPTION OF THE PREFERRED EMBODIMENTS

Figures 1A, 1B:
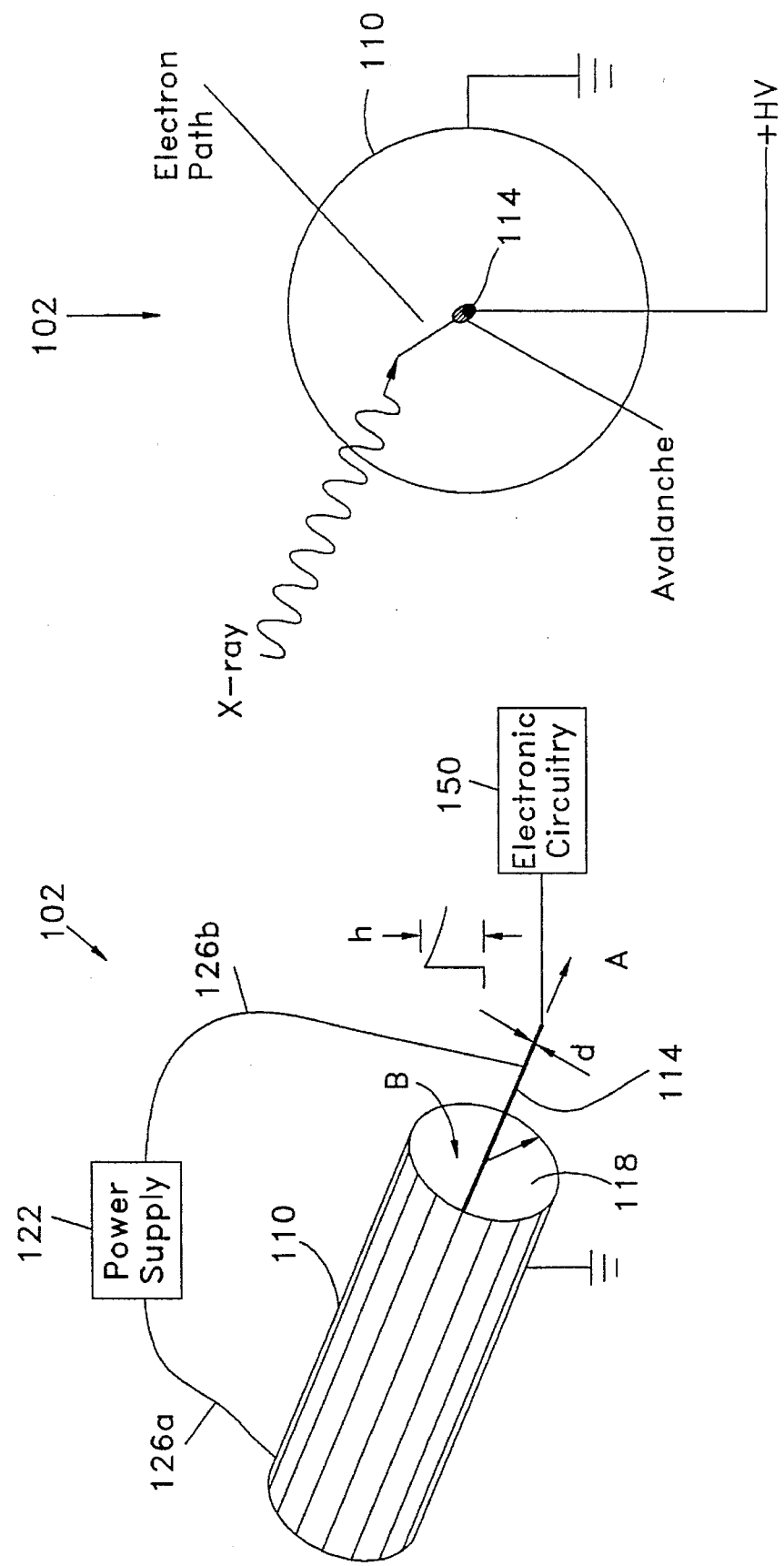
FIG. 1A shows a schematic representation of a proportional counter and FIG. 1B shows a cross-sectional view of that proportional counter.
Figure 2:
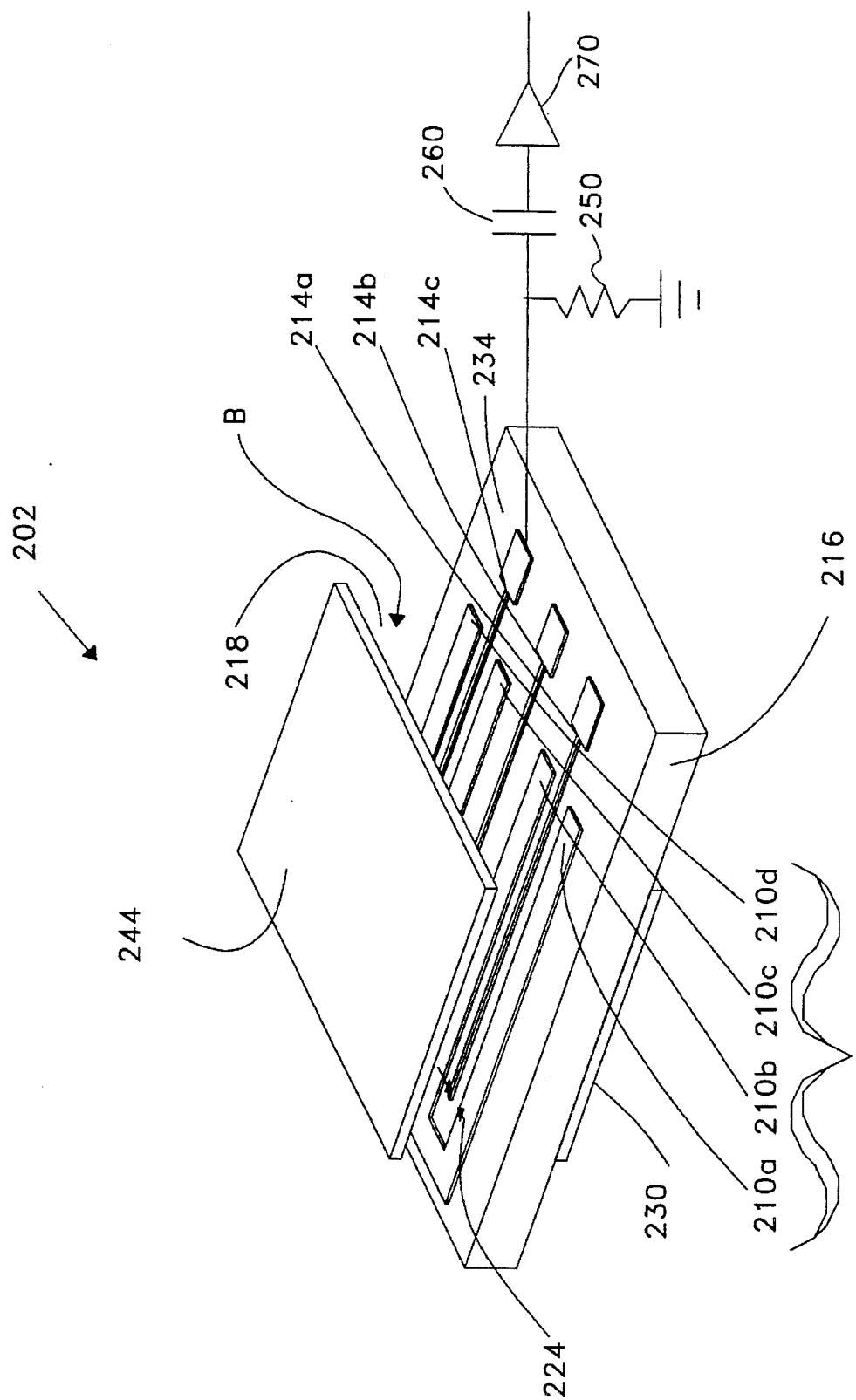
FIG. 2 shows a schematic representation of an x-ray microstrip proportional chamber or detector with multiple microstrip anodes.

FIG. 2 shows a schematic representation of an x-ray microstrip gas proportional chamber or detector 202 consisting of two equipotential planes (back potential plane 230 and cathode plane 244) with an intervening third plane made up of multiple microstrip anodes 214a–214c and potential strips 210a–210d deposited on and attached to surface 234 of insulating substrate 216. See A. Oed, "Position-Sensitive Detector with Microstrip Anode for Electron Multiplication with Gases", Nucl. Instrum. Methods, A263, 351 (1988), the contents of which are incorporated herein by reference. Anodes 214a–214c and interspaced potential strips 210a–210d are solidly bonded to surface 234 of substrate 216, thus permitting stable operation with much closer spacing than would be possible with the freely suspended wire anodes of a multiwire proportional detector. Although three anodes and four potential strips are shown, any number of such strips can be used. Photolithographic techniques are used to pattern a thin aluminum, copper, or other metal layer into potential strips 210a–210d and anodes 214a–214c. Potential strips 210a–210d can be anywhere from less than about 50 μm to more than about 200 μm wide and preferably about 90 μm wide. Anodes 214a–214c can be anywhere from about 1 to 100 μm wide and preferably about 10 μm wide. Insulating gaps 224 between potential strips 210a–210d and anodes 214a–214c can be anywhere from a few μm to several hundred μm and preferably about 50 μm. Insulating substrate 216 can be anywhere from 1 μm to more than 1000 μm thick and preferably about 15 μm thick. Cathode plane 244 can be arranged anywhere from less than 1 millimeter to more than 10 millimeters and preferably about 5 millimeters above surface 234. Cathode plane 244 must be at least partially transparent to x-rays with energies in the desired detection range. A gas 218, which is typically argon-methane or xenon-methane, fills volume B of chamber 202. Cathode plane 244 may serve the dual function of establishing an electric field in volume B and preventing the escape of gas 218, or a separate x-ray transparent window (not shown) may be placed parallel to and in close proximity to cathode plane 244 to allow x-rays to enter volume B while preventing loss of gas 218. This x-ray transparent window is sealed to a pressure cell (not shown) that permits control of the operating pressure of gas 218 in volume B.

When the detector is in operation, voltages are applied to each of the four distinct sets of electrodes 230, 210a–210d, 214a–214c, and 244 to establish and control electrostatic fields in volume B and in the vicinity of potential strips 210a–210d and anodes 214a–214c. Back potential plane 230, potential strips 210a–210d, and cathode plane 244 are held at operating voltages HV1, HV2, and HV3, respectively, while anodes 214a–214c are each held at ground potential through a resistor 250, typically 1 to 10 Megohms. Note that potential strips 210a–210d are all electrically connected together, whereas anodes 214a–214c are electrically isolated from all other electrodes and connected together to a common potential (typically ground) only through large value resistors. Operation of anodes 214a–214c at other potentials by connection to a power supply is also possible if they are coupled to signal processing electronics 270 through capacitor 260. When gas 218 is a mixture of 90% argon and 10% methane at a pressure of about 16 psig, when the microstrip proportional chamber geometry is as described above, and when the anodes 214a–214c are at 0 volts, values of −200 volts, −500 volts, and −2000 volts for HV1, HV2, and HV3, respectively, have been used to test the performance of the detector. Values of HV1, HV2, HV3, and the anode potentials can range from 0 to a few thousand volts, positive or negative polarity, depending primarily on the detector geometry, the sizes and spacing of potential strips 210a–210d and anodes 214a–214c, the thickness of insulating substrate 216, the pressure and composition of gas 218, and the distance between cathode plane 244 and surface 234. The key constraints on polarity and magnitude of applied voltages are that electrons resulting from ionization of gas 218 in volume B drift toward surface 234 and are further accelerated sufficiently by the electric field around one of the anodes 214a–214c to give rise to gas avalanche amplification. Optimum values of applied voltages must be determined separately for each chamber configuration. In addition, all voltages may be shifted by the same additive constant voltage with little or no change in detector performance, thus allowing free choice of which one of the four may be held at ground potential (0 volts).

X-rays enter volume B through the x-ray transparent window (if present) and cathode plane 244. Each x-ray photon has a probability of ionizing gas 218. That probability increases with both the atomic number and the density of gas 218. These characteristics are controlled by the composition and pressure, respectively, of gas 218. The electric field established by the potential planes accelerates the electrons and ions resulting from an ionizing event in opposite directions, with the electrons moving toward surface 234. As the electrons approach one of the anodes 214a–214c, they are further accelerated by the high electric field around that one anode (positive relative to the nearby potential strips) which causes additional ionizations. The result of this cascade of events will be a pulse of charge proportional to the energy of the incoming photon, but amplified by as much as a factor of $10^5$ over the charge generated by the original ionizing event. This latter pulse of charge is the signal applied to the input of active signal processing circuits, each including protection, amplification, and shaping circuits, as well as a plurality of energy window circuits and digital counters to be discussed below. For simultaneous (parallel) use of available pixels, each anode 214a–214c must have its own separate electronic chain. The position of the x-ray ionization event is preserved first by the uniformity of the electric field in the drift region of volume B and next by which one of the plurality of anodes 214a–214c and associated signal processing, digitizing, and counting electronics records a pulse.

Figure 3A:
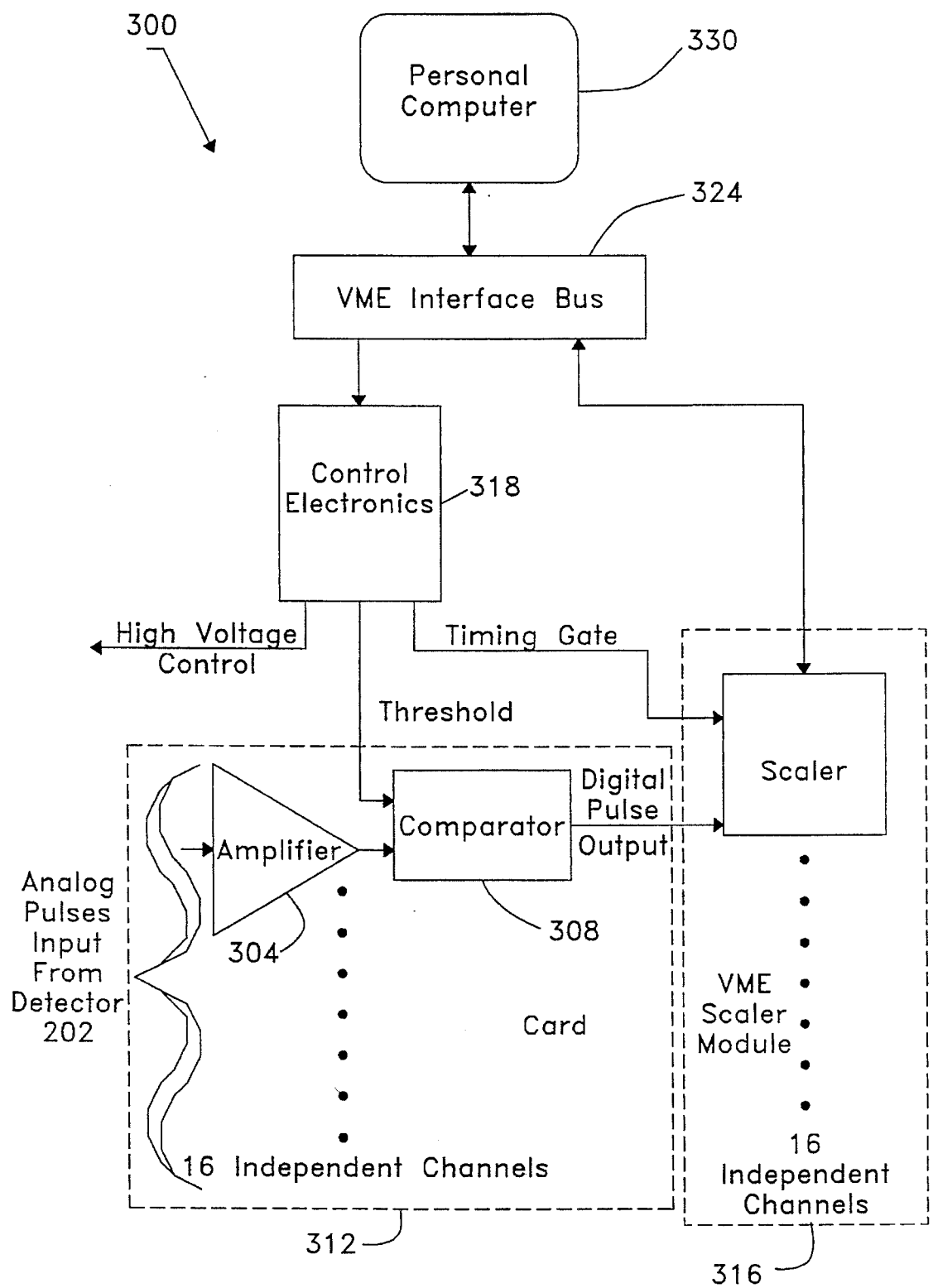
FIG. 3A shows a block diagram of signal processing electronics used to test the microstrip proportional chamber of FIG. 2 by counting together all x-ray photons above a set threshold collected by each microstrip anode separately and FIG. 3B shows a block diagram of signal processing electronics used to test the microstrip proportional chamber of FIG. 2 by digitizing the energy spectrum of x-ray photons collected by a block of 16 microstrip anodes connected together in parallel.

FIG. 3A shows a block diagram of one version of signal processing electronics 300 used to test microstrip proportional chamber or detector 202. Each anode of detector 202 was connected to an amplifier 304 and comparator 308 on a commercially available card 312 (LeCroy model 2735PC). Each card 312 contains 16 independent sets of amplifiers and comparators. Card 312 produced a digital output pulse for input signals greater than a comparator threshold voltage output from control electronics 318. Control electronics 318 was an assemblage of modules including: Greenspring Computers model VIPC610 VMEbus IndustryPack carrier, model IP-DAC IndustryPack digital to analog converter, and model IP-DUAL PI/T IndustryPack dual programmable interface/timer; a custom built interface buffer circuit; and LeCroy model 429A logic fanout. Pulses were sent from each card 312 to VME scaler module 316 (LeCroy model 1151E) which accumulated statistics separately for each of 16 channels during a preset time interval established by gate signals output to VME scaler module 316 from control electronics 318. For our prototype system, 6 separate cards 312 and 6 separate VME scaler modules 316 acquired data from a total of 96 anodes in our linear array microstrip gas proportional chamber. An interface bus 324 was used to accommodate the 6 VME scaler modules 316 and portions of the control electronics 318. A personal computer 330 allowed us to control the entire system via a data acquisition program.

Figure 3B:
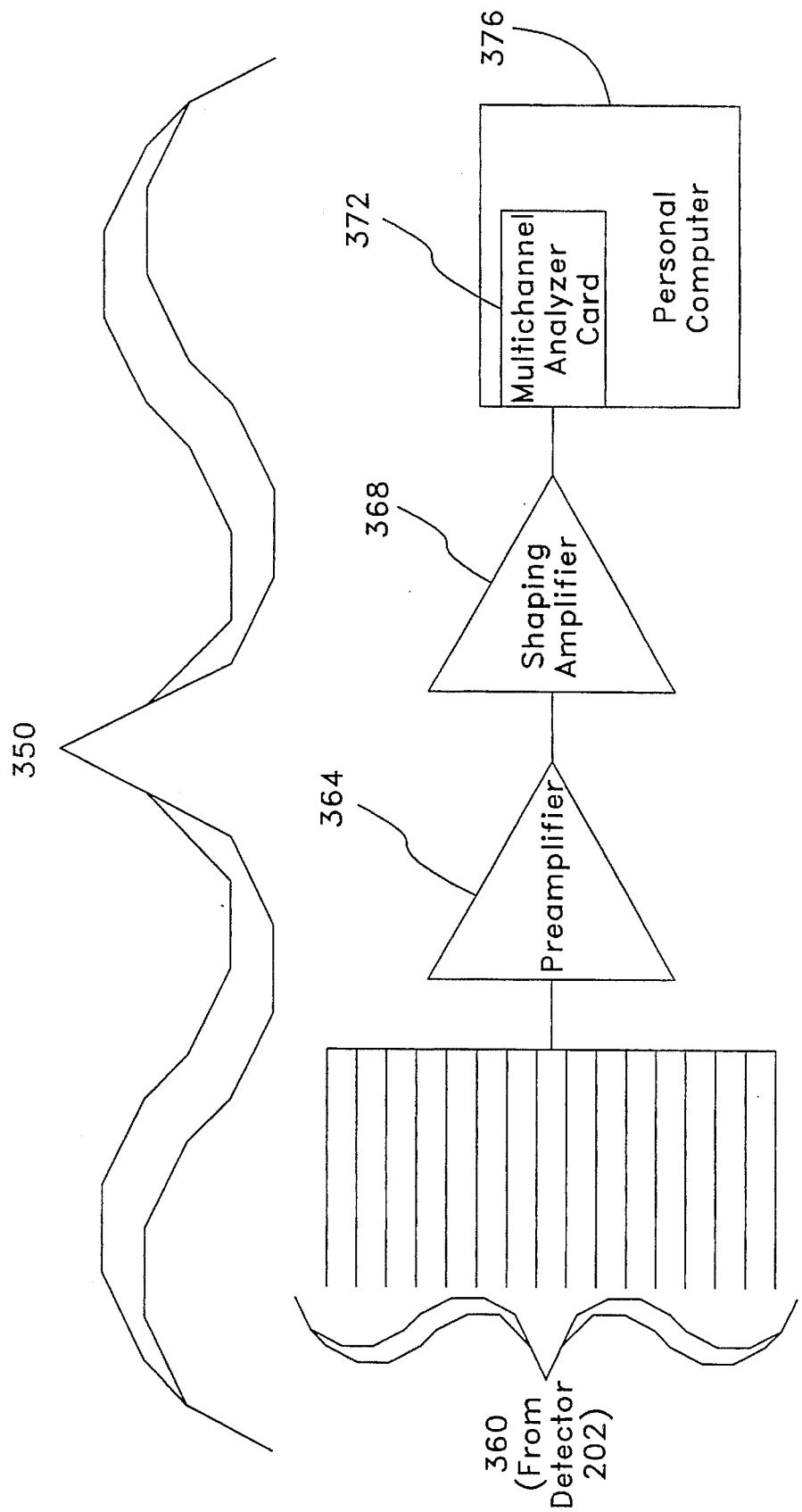

FIG. 3B shows a block diagram of another version of signal processing electronics 350 used to test microstrip proportional detector 202. A block of 16 anodes or channels 360 of detector 202 were connected together in parallel and signals from them were connected in turn to the input of a preamplifier 364 (eV Products model 5093). The output of the preamplifier 364 was connected to the input of a shaping amplifier 368 (EG&G Ortec model 572). The linearly amplified and shaped pulses from shaping amplifier 368 were then sent to multichannel analyzer card 372 (EG&G Ortec model 916A) which was housed in and controlled by personal computer 376.

Figure 4A:
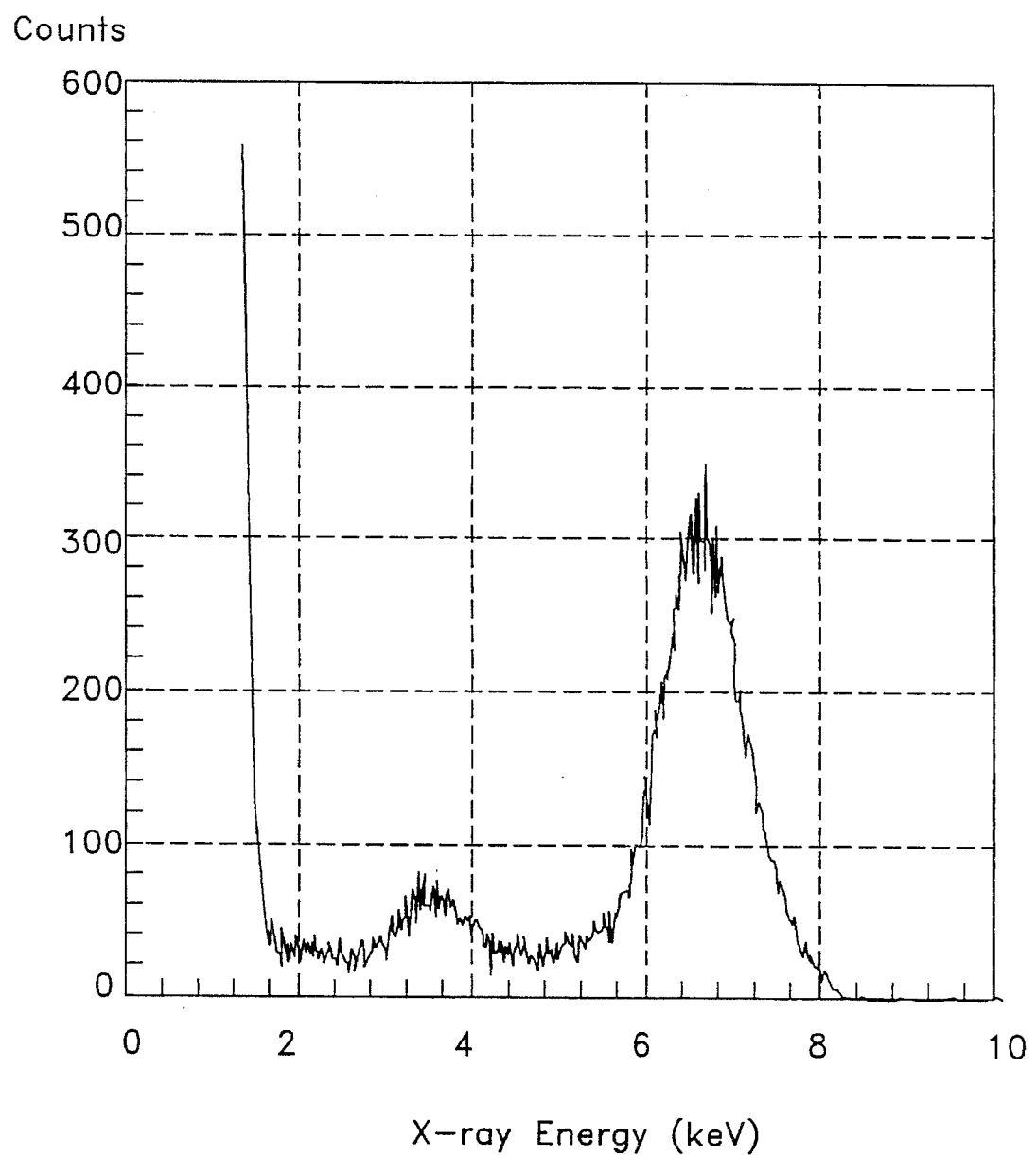
FIGS. 4A and 4B show results of detecting x-rays output from $^{55}$Fe and $^{241}$Am x-ray sources, respectively, using the detector with signal processing electronics of FIG. 3B.
Figure 4B:
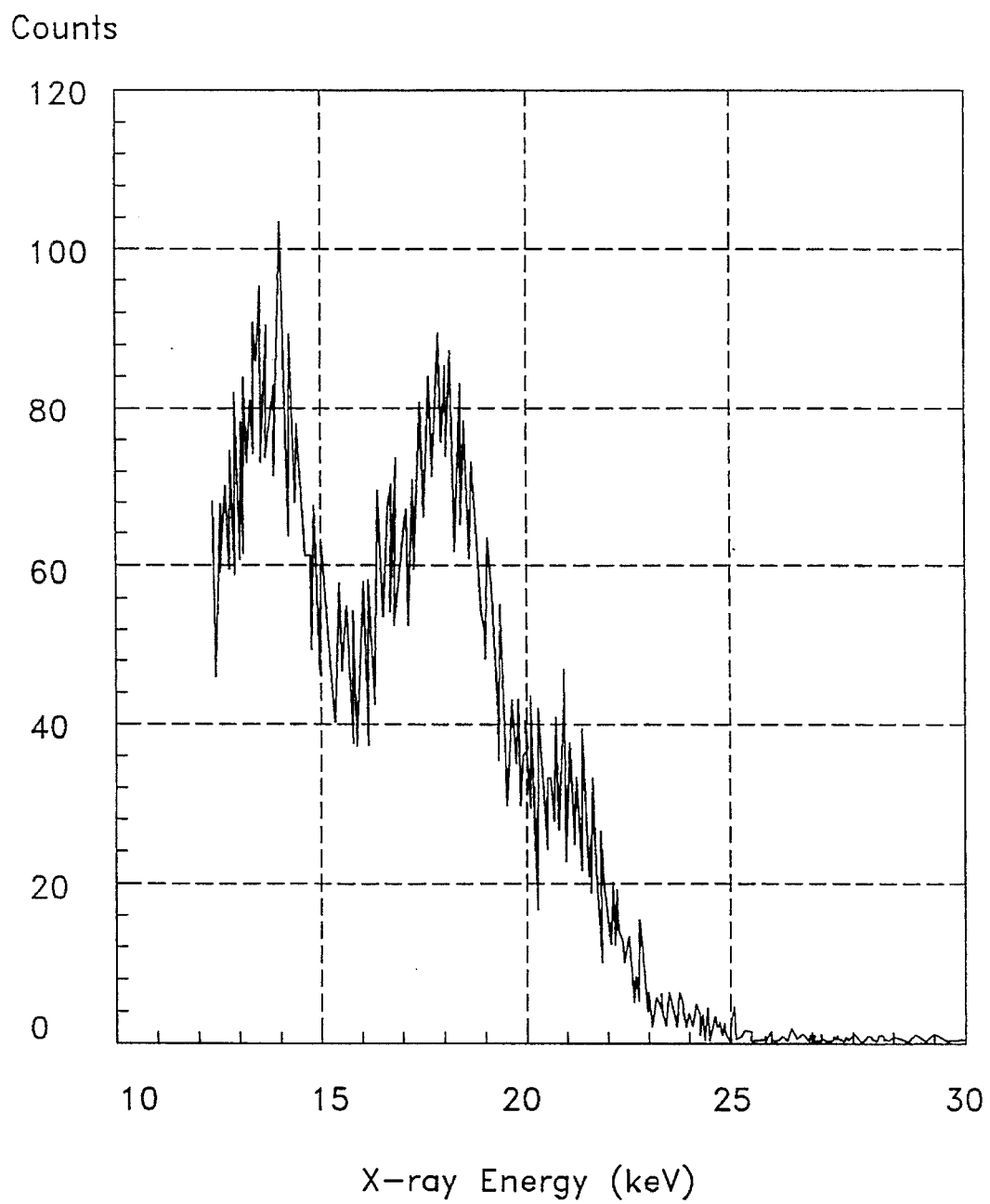

FIGS. 4A and 4B show results of detecting x-rays output from $^{55}$Fe and $^{241}$Am x-ray sources, respectively, using detector 202 with processing electronics 350. $^{55}$Fe has a 5.9 keV emission line, and $^{241}$Am has emission lines at 14, 18, and 21 keV. The measured width of the line at 5.9 keV is 1.0 keV (FWHM), which is considerably better than can be achieved with a scintillation detector such as sodium iodide. In these tests, gas 218 consisted of 90% argon and 10% methane at a pressure of 16 psig. Under these conditions, the efficiency at higher energies for converting x-rays fell for energies greater than 20 keV. The efficiency can be improved, however, by increasing the pressure of gas 218 and switching to a xenon based gas mixture.

When detector 202 is combined with a modified version of electronics 300 that for each anode implements energy intervals or windows using pairs of comparators, corresponding analog threshold voltages, and logic to provide output pulses for input pulses above the lower threshold but not exceeding the upper threshold for each interval or window, the resulting system should efficiently detect x-rays in the energy range from 1 keV to 150 keV With an energy resolution as low as 1 keV or less and a spatial resolution limited primarily by the pixel size, typically 200 to 100 micrometers. It could be used in digital radiography and computed tomography. In particular, it could acquire energy-resolved images, thus allowing sensitivity to selected chemical elements or compositions. This non-integrated x-ray detector system, one possible version of which is currently under construction, would be useful primarily for research purposes only, since the distributed electronics, the interconnecting cabling, and the high density of electromechanical contacts would make it too bulky, fragile, and susceptible to noise pickup for any but carefully controlled laboratory environments. A much more practical device, described in greater detail below, could be made by combining a microstrip proportional chamber with a complete customized set of signal processing and acquisition electronics fabricated on a semiconductor substrate using standard microelectronics techniques. Such a fully integrated detector would combine a device originally developed for research applications with high-density electronics to make a compact rugged detection system suitable for industrial or possibly even medical uses.

Integration of Detector and Electronics

Previous implementations of microstrip gas proportional chamber technology have used various substrate materials, such as glass, plastic, or even silicon as the mechanical support for the photolithographically defined electrode structures. In the latter case, the silicon was used in such a way as to render impossible incorporation of active signal processing circuits. (See the discussion at the end of the section entitled "Background of the related Art".) A key weakness of all these implementations is that they have used only external electronic signal acquisition circuitry, which results in a rather bulky and fragile system with poor noise immunity due to a large number of long interconnecting cables and poor reliability due to the high number of easily damaged connections.

Figure 5:
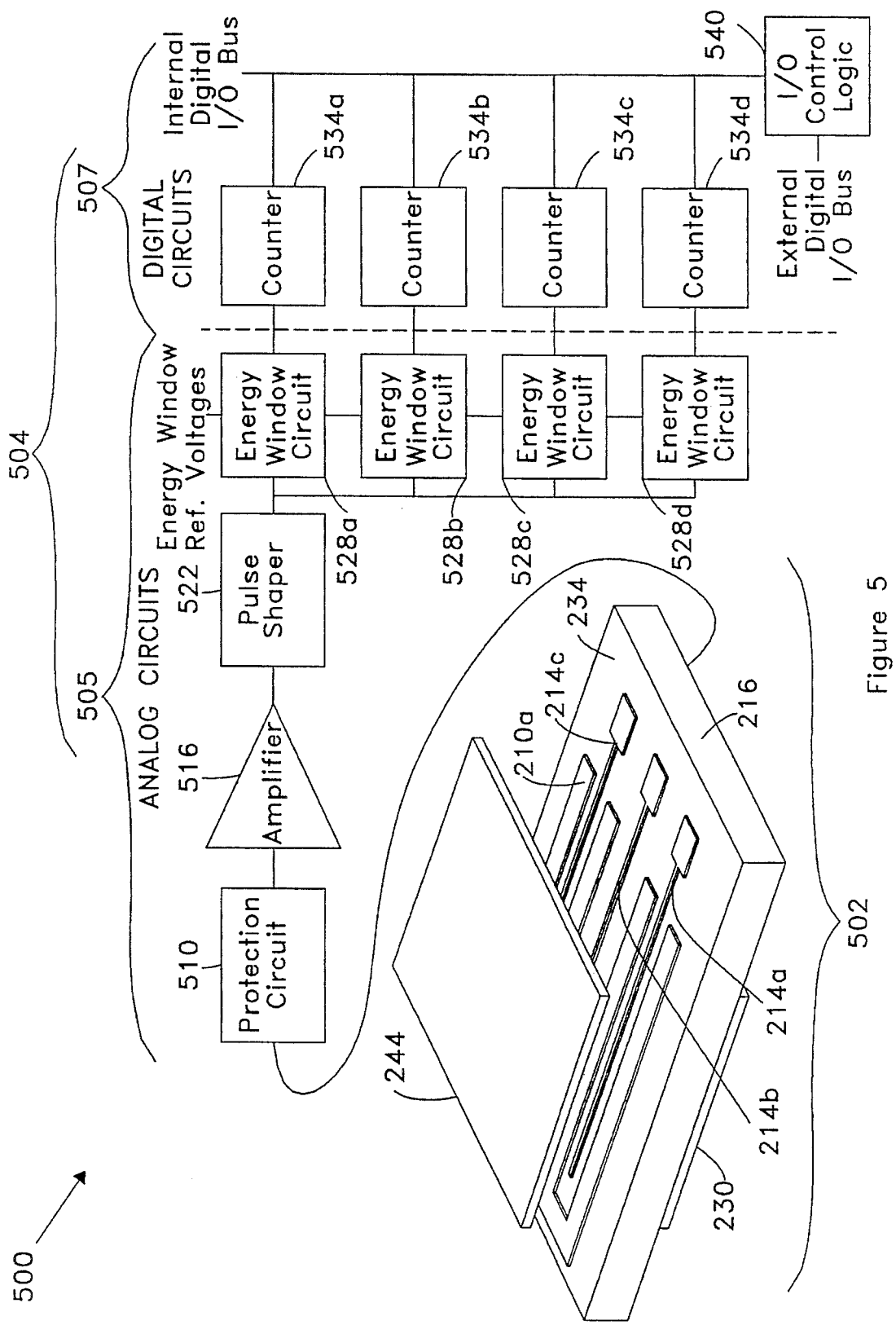
FIG. 5 shows a schematic of an x-ray detection system according to one embodiment of the invention wherein the signal processing electronics are illustrated for only one of the plurality of microstrip anodes.

Construction of a fully integrated detection system starts from a silicon or other semiconductor wafer containing the circuits needed for the counting chains for each microstrip anode 214a–214c as shown schematically in the block diagram of FIG. 5 for anode 214c. Bipolar, metal-oxide-semiconductor, or other technology may be used to construct the circuits described below. Considerations that affect the choice of device fabrication technology include maximum desired pulse throughput, total power dissipation, device radiation hardness, and cost. Many of the details of the circuit design will be governed by the chosen fabrication technology. We now describe the basic functional features required for the detection system without reference to the subtleties of any specific device technology.

Figure 6A:
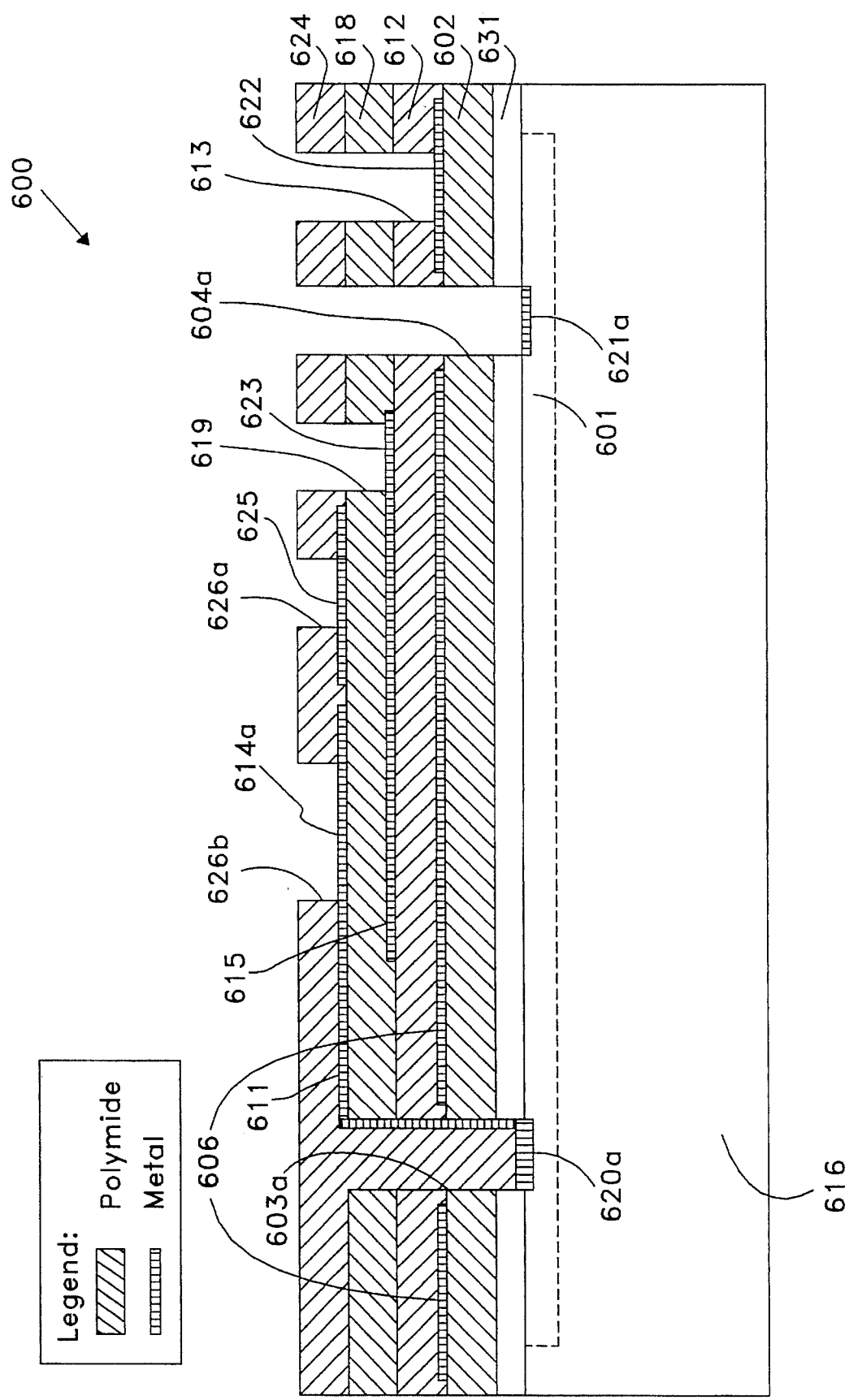
FIG. 6A is a schematic cross sectional view of a wafer containing integrated processing electronics and having a microstrip detector fabricated thereon.

FIG. 5 shows an x-ray detection system 500 according to one embodiment of the invention and FIG. 6A shows a schematic cross section view of an integrated x-ray detector system 600 corresponding to system 500. As will be discussed, microstrip proportional chamber 502, with the exception of cathode plane 244, is fully integrated in a supporting substrate along with active signal processing circuits 504 made up of analog circuits 505 and digital circuits 507. Integration of circuits 504 in the supporting silicon substrate allows amplifier 516 and protection circuit 510 to be placed close to anode 214c, thus reducing the pickup of undesired electromagnetic noise. Careful layout of the integrated electronics is needed to insure that crosstalk between the circuits corresponding to 504 for the other anodes (not shown) is minimized. Likewise, judicious layout and design are needed to minimize coupling between the digital circuits 507 and the analog circuits 505 for all channels. Since the detection system will necessarily be exposed to high radiation fields, external shielding (not shown) must be used to restrict exposure to a well defined portion of the wafer, which should be kept clear of circuit elements susceptible to radiation damage. This wafer-scale integrated device must be fully passivated and have input and output contact pads appropriate for connection of the subsequently fabricated anodes to the inputs of the signal processing circuitry, for connection of the various analog threshold voltages needed to define the energy windows, and for connection of the digital outputs and control signals.

The right hand side of FIG. 5 shows a conceptual block diagram, which we now describe in greater detail, of one possible embodiment of the signal processing electronic circuits 504 to be integrated into the supporting silicon substrate and which are typical for each anode. Following the blocks in sequence, the detector signal at anode 214c is input to protection circuit 510 which prevents damage to the rest of the electronics in the event of a high voltage discharge in detector 502. Protection circuit 510 will typically consist of high speed signal diodes arranged "back-to-back" to clamp the magnitude of the voltage at the input of amplifier 516 such that it does not exceed the forward voltage drop of the diodes, typically 0.6 volts for silicon. A low noise, high bandwidth amplifier 516 converts the charge at its input to a voltage output. Pulse shaper 522 processes the incoming signal using pole-zero cancellation and bandwidth limitations to improve pulse rate throughput while maintaining low noise. The current pulse shape intrinsic to gas proportional detectors consists of a rapidly rising edge followed by a slowly decaying tail. The total integrated charge is proportional to the energy released by the ionizing event. While it is in principle possible to integrate this current pulse to obtain the total charge, the slowly decaying tail would force a long integration time and thus limit the maximum count rate for each detector channel. Since the decay rate of the pulse is fixed by the details of the detector, the initial height of the current pulse is a direct (albeit somewhat less accurate) measure of the total charge. The design parameters of amplifier 516 and pulse shaper 522 are chosen to strike a balance between the accuracy of conversion of total charge to voltage pulse height and maximum count rate throughput. Each energy window circuit 528a–528d that follows consists of a pair of high speed comparators (not shown) with separate externally supplied reference voltages to define upper and lower energy (pulse height) thresholds. Each energy window circuit 528a–528d further includes logic to provide a standard digital output if the input pulse voltage is between the lower and upper thresholds. While four such energy window circuits are illustrated, the actual number would depend on the application and could be more or less than four. Note that the boundary between analog and digital electronics generally lies in the comparators and the associated logic gates of the energy window circuits 528a–528d which convert a linear voltage pulse from the pulse shaper 522 to a standard digital logic pulse if the amplitude of that linear voltage pulse falls within one of the defined intervals. Hence, energy window circuits could be considered to lie in either analog circuits 505 or digital circuits 507 and are depicted to be in analog circuits 505 in FIG. 5 for convenience only.

A resulting digital output then passes to counters 534a–534d, respectively. Each counter could be implemented, for example, by a cascade of flip-flops with as many as 32 bits. I/O control logic 540 allows sequential readout and control of counters 534a–534d. This on-wafer buffering of data and the ability to multiplex counters 534a–534d during readout is critical as it dramatically reduces the density of connections required.

Energy Window Circuits

In most practical x-ray inspections, a great deal is already known about the specimen under investigation. In particular, its average composition is reasonably well defined. As such, it is unnecessary to acquire full energy spectra. Processing electronics 504 for each anode 214a–214c allow a user to set the lower and upper energy limits of a small number of independent intervals or windows via energy window circuits 528a–528d. Pulses falling within each window are summed together by counters 534a–534d, respectively. Pulses outside all of the set windows are not counted. This allows the simultaneous collection of data from several energy ranges, i.e., the construction of energy resolved images, each from a different selected window. This in turn allows chemical element contrast in radiographs and enables a new class of x-ray inspections of unprecedented sensitivity which are ideally suited to inspection of composite materials and many other applications.

Fabricating the Integrated X-ray Detector System

Figure 6B:
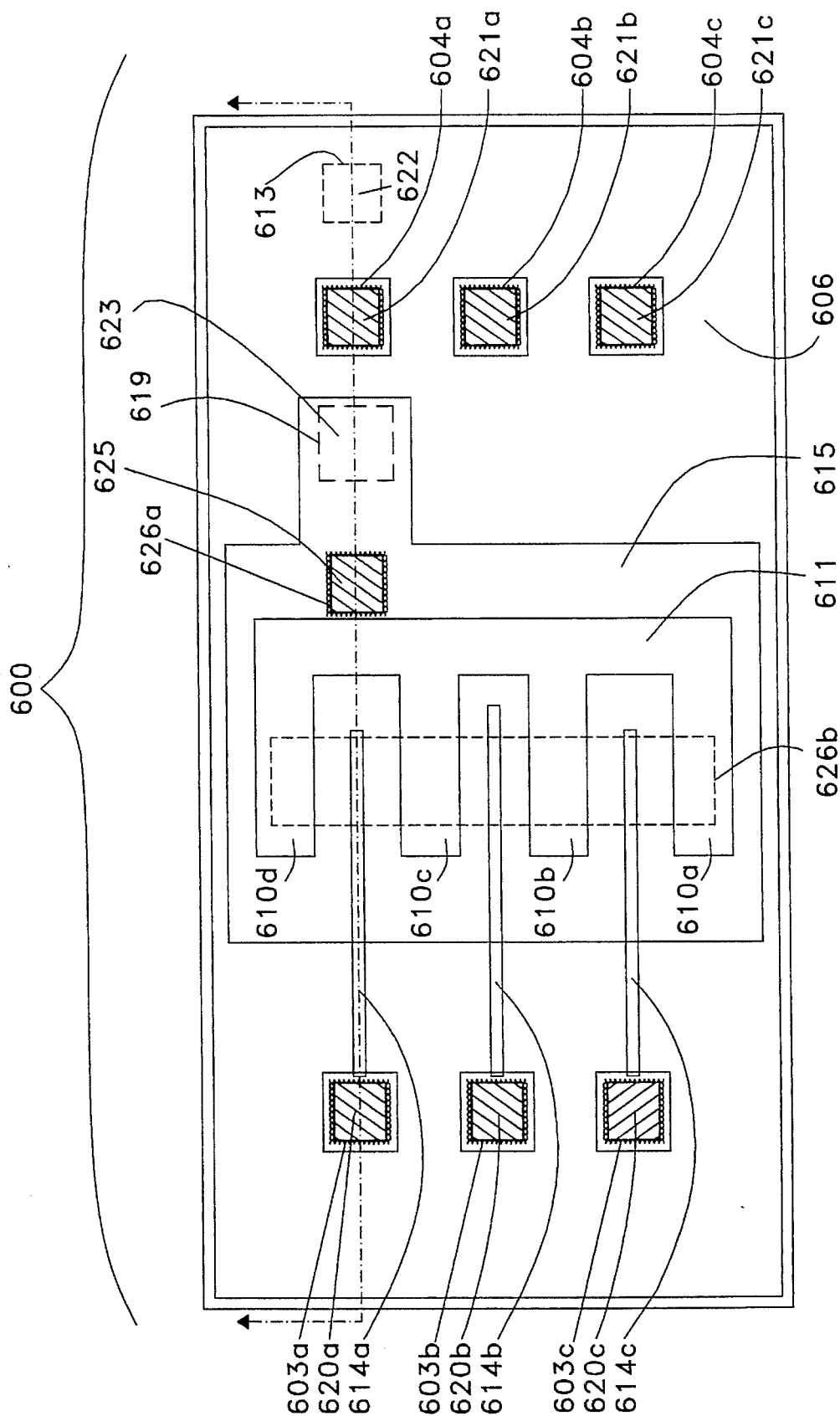
FIG. 6B shows a schematic plane view of the anode/potential strip metal layer of FIG. 6A seen looking down from the top of FIG. 6A.

Spun-cast polyimide resin layers and evaporated metal films are used together with conventional photolithography techniques to build the microstrip gas proportional detector on top of the passivated wafer containing the signal processing circuits and associated contacts as described above. These technologies require relatively low substrate temperatures (typically 250°–350° C. to cure the polyimide) that will not appreciably alter the characteristics of the active devices present in the substrate. FIG. 6A is a schematic cross section view of wafer 616 containing processing electronics 504 in a layer 601 with passivation layer 631. Polyimide layers are represented by a slanted line pattern and metal layers by heavy black lines. FIG. 6B shows a top view of a portion of wafer 616 with metal layers 606, 615, and 611 of FIG. 6A represented by different shades, and with openings through the (transparent) polyimide represented by white dotted lines. Layer 611 consists of potential strips 610a–610d and associated contact 625, which are all continuous, and anodes 614a–614c, which are all separated from each other and from potential strips 610a–610d.

Figure 6C:
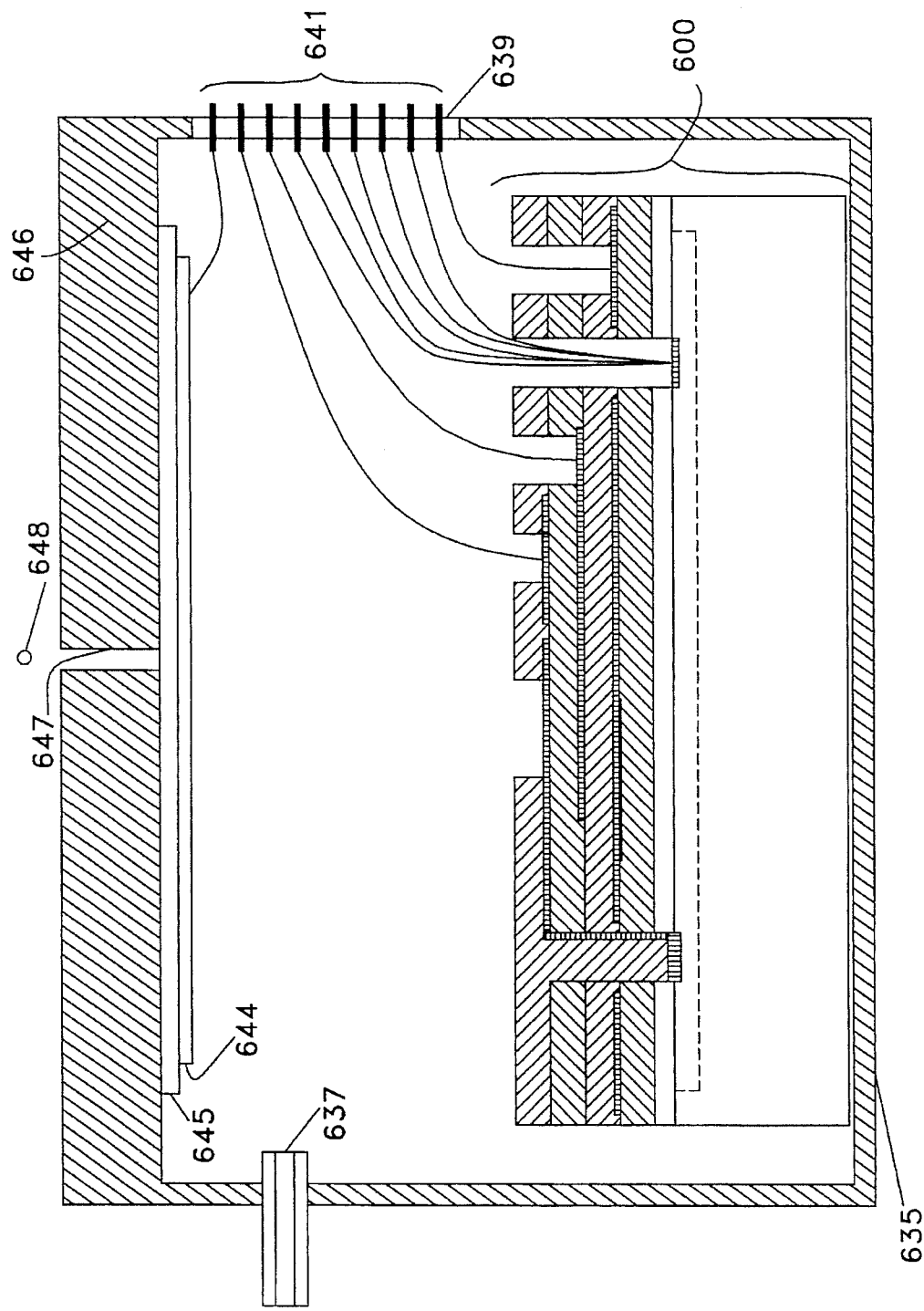
FIG. 6C is a schematic representation of one possible embodiment of the assembled detector showing the pressure cell, the x-ray transparent window, the cathode plane, the electrical and gas feedthroughs, and the electrical connections.

The correspondences between features of the simplified schematic representation of a microstrip gas proportional detector of FIG. 2 and those of the integrated version of FIGS. 6A, 6B, and 6C are as follows. Substrate 216 is replaced by polyimide layer 618. Back potential plane 230 is replaced by metal back potential plane 615. Anodes 214a–214c are replaced by anodes 614a–614c. Potential strips 210a–210d are replaced by potential strips 610a–610d. Cathode plane 644 of FIG. 6C corresponds to cathode plane 244 of FIG. 2 and is a separate required feature of the detector system, although it is not integrated into the supporting wafer 616. As discussed above, the cathode plane may be the x-ray transparent window itself, or may be in close proximity to a separate x-ray transparent window 645 and possibly electrically isolated from it.

Before describing in detail the fabrication sequence for constructing the integrated microstrip gas proportional chamber x-ray detector system, we will first mention some general practices used during fabrication. The polyimide resin (either Brewer Science π-Polyim P-18 or OCG Microelectronic Materials Probimide 514) is spun on at a speed and for a time required to yield the desired film thickness (typically 10 to 15 micrometers) according to the resin manufacturer's data. Thicker films have been obtained by spin coating multiple layers of resin. Each layer is baked to remove solvents before subsequent process steps, and partially cured according to the resin manufacturer's instructions if wet etch patterning is needed. Positive photoresist (Hoechst-Celanese AZ 1350J-SF) has been used for all lithography steps. Tetramethylammonium hydroxide based photoresist developer (Hoechst-Celanese AZ 312 MIF) has been used both to etch the exposed photoresist and to wet etch the partially cured polyimide resin. The liftoff technique has been used to pattern all metal layers. After final curing according to the resin manufacturer's instructions, all polyimide layers requiring either subsequent metal deposition or application of additional polyimide resin layers are etched in an oxygen plasma to microscopically roughen the polymer surface to promote adhesion. In addition, metal layers are generally composites made up of a thin (100–200 Å) titanium layer to improve adhesion to the polyimide, a thicker layer of the primary metal (approximately 1 micrometer), and for those primary metals requiring oxidation protection, a thin (500–600 Å) layer of gold.

Figure 6D:
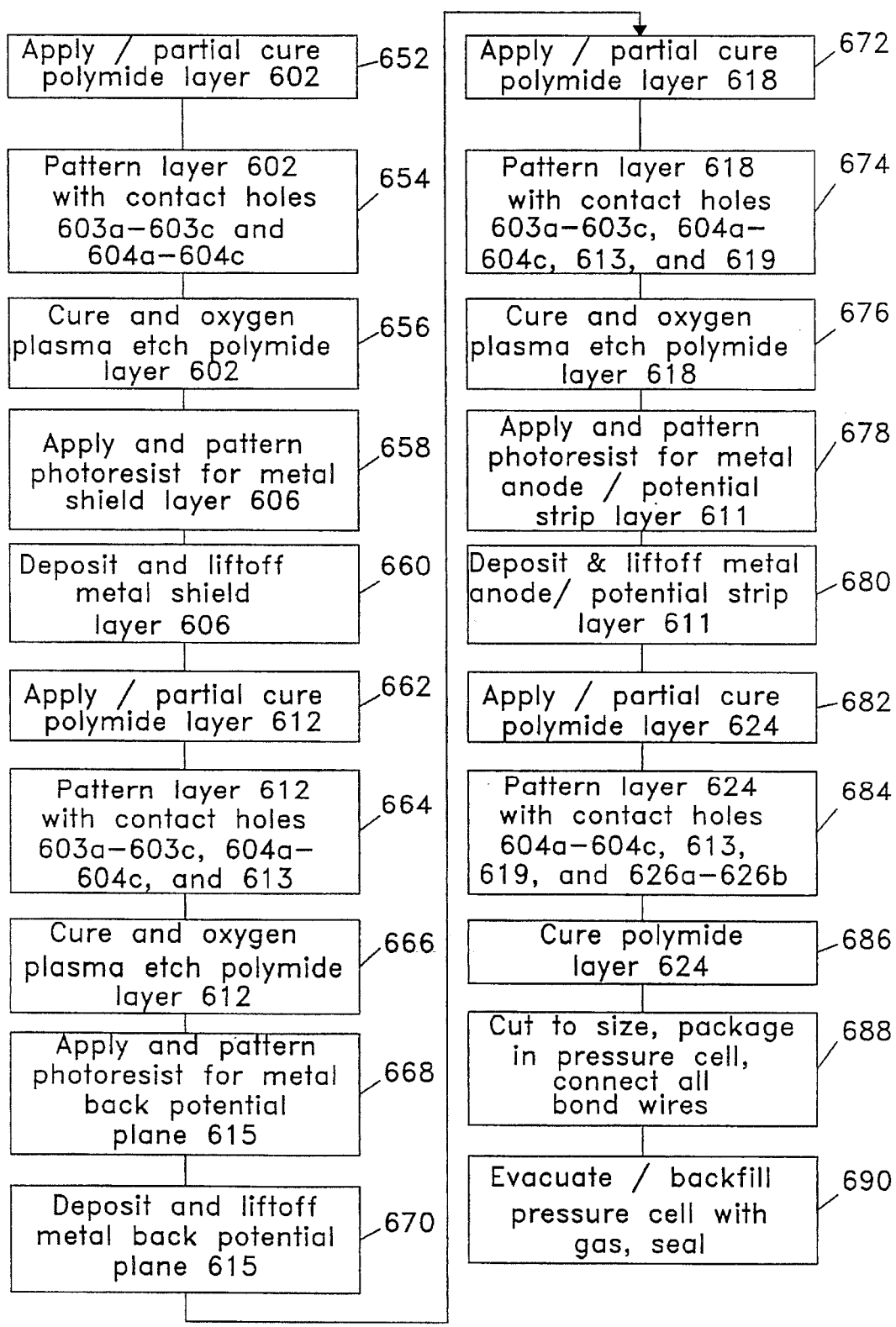
FIG. 6D shows process steps for building the detector system shown in FIGS. 6A–6C.

FIG. 6D summarizes the process steps needed to fabricate an integrated microstrip gas proportional chamber x-ray detection system. Refer to FIGS. 6A–6C to see schematic representations of the various elements described below and their relative locations. At step 652 of FIG. 6D, apply polyimide resin layer 602 on top of passivation layer 631 over integrated signal processing circuits 504 in layer 601 of wafer 616 and partially cure to permit subsequent patterning by wet etching. Pattern layer 602 at step 654 with contact holes 603a–603c and 604a–604c needed to expose anode signal contacts 620a–620c and analog threshold input and digital signal contacts 621a–621c, respectively, by coating layer 602 with photoresist, exposing the photoresist with ultraviolet light through a mask, and etching both the exposed photoresist and the underlying partially cured polyimide resin with the photoresist developer mentioned above. After stripping the residual photoresist, fully cure layer 602 according to the resin manufacturer's instructions and oxygen plasma etch it to prepare the surface for subsequent processing at step 656. To use the liftoff technique to pattern metal layers, apply photoresist and pattern it using a mask and ultraviolet light for metal shield layer 606 at step 658. Deposit the metal for shield layer 606 and liftoff the excess in acetone at step 660. At step 662, apply and partially cure polyimide resin layer 612. Pattern layer 612 at step 664 with contact holes 603a–603c and 604a–604c to expose contacts 620a–620c and 621a–621c, respectively, and with contact hole 613 to define shield plane 606 contact 622. At step 666, strip the residual photoresist, fully cure layer 612, and oxygen plasma etch the surface. Apply and pattern photoresist for metal back potential plane 6 15 at step 668. Deposit and liftoff metal for back potential plane 615 at step 670. At step 672, apply and partially cure polyimide resin layer 618. Pattern layer 618 at step 674 with contact holes 603a–603c, 604a–604c, and 613 to expose contacts 620a–620c, 621a–621c, and 622, respectively, and with contact hole 619 to define back potential plane 615 contact 623. At step 676, strip the residual photoresist, fully cure layer 618, and oxygen plasma etch the surface. Apply and pattern photoresist for metal anode/potential strip layer 611 at step 678. Deposit and liftoff metal for anode/potential strip layer 611 at step 680, defining anodes 614a–614c and potential strips 610a–610d. Note that electrical connection is automatically made between anodes 614a–614c and analog signal input contacts 620a–620c through contact holes 603a–603c, respectively, when the anodes 614a–614c are created at steps 678 and 680. That is because the design of masks for the lithography of step 678 insures registration between the ends of anodes 614a–614c and contacts 620a–620c. At step 682, apply and partially cure polyimide resin layer 624. Pattern layer 624 at step 684 with contact holes 604a–604c, 613, and 619 to expose contacts 621a–621c, 622, and 623, respectively, and with open areas 626a–626b to define potential strip contact 625 and the active detector area. At step 686, strip the residual photoresist and fully cure polyimide layer 624. The surface conductivity of the detector 600 may be modified at this point by application of coatings, ion implantation, or other means to alter performance characteristics if desired. Cut device 600 to size, package in pressure cell 635 (see schematic diagram of FIG. 6C), connect all necessary power, threshold, and signal bond wires to pins 641 of hermetically sealed electrical feedthrough 639, and close the assembly at step 688. At step 690, evacuate the pressure cell, backfill with the desired detector gas, and seal the cell assembly using sealable gas inlet 637. Pressure cell 635 may have radiation shielding 646 with slit 647 to limit radiation from source 648 to a narrow portion of detector 600 corresponding to the active area defined by 626b.

Other substrates that support microelectronic device fabrication, such as gallium arsenide or silicon-on-insulator material, could be substituted for monocrystalline silicon as wafer 616. Other dielectric materials common in microelectronic fabrication processes could be used in place of polyimide resin. These materials include silicon oxide deposited by low temperature techniques such as plasma enhanced chemical vapor deposition or ozone/TEOS or silicon nitride deposited by similar techniques, as well as silicon oxynitride. Other polymer resins could be substituted for the polyimide. The polyimide or other polymer dielectrics could be patterned by using a spin-on-glass mask material followed by plasma etching. The various metal layers could be fabricated by deposition followed by either wet or dry etching rather than by liftoff. Electronic processing circuits 504 could be implemented with either bipolar or MOS device technologies. With appropriate changes in design, signals from anodes 614a–614c could be capacitively coupled rather than direct coupled to protection circuit 510, thus allowing the anodes 614a–614c to operate at elevated voltages. Other variations include segmenting back potential plane 615 to implement a two dimensional array using capacitive coupling. This would require significant modification of the signal processing electronics to permit coincidence counting to obtain separate x and y coordinates of ionizing events. If needed to improve noise immunity, the counters could be moved off the detector wafer and be built into a separate piece of silicon. This latter hybrid configuration would reintroduce the problem of a large number of interconnections, but might be appropriate comprise for applications where power dissipation or analog/digital noise coupling considerations force mixed signal processing electronics technologies.

What is claimed is:

1. An integrated apparatus, comprising:
   a wafer;
   an x-ray detector fabricated on said wafer having a housing, a plurality of anodes and a gas contained in said housing, wherein at least a portion of said housing passes x-ray photons which partially ionize said gas thereby producing at least one pulse at one of said plurality of anodes;
   a plurality of active signal processing circuits integrated into said wafer and respectively coupled to said plurality of anodes, wherein a respective one of said plurality of signal processing circuits receives and processes said at least one pulse to yield a digital signal indicating location of said one of said plurality of anodes and amplitude of said pulse; and
   an electrically isolating layer for electrically isolating said x-ray detector from said plurality of active signal processing circuits.

2. The integrated x-ray detection system as claimed in claim 1, wherein said plurality of anodes comprise a plurality of microstrip anodes.

3. The integrated x-ray detection system as claimed in claim 2, further comprising a plurality of potential strips respectively interposed between said plurality of microstrip anodes.

4. The integrated x-ray detection system as claimed in claim 1, wherein said plurality of active signal processing circuits comprises a respective plurality of analog circuits coupled to said plurality of anodes and a respective plurality of digital circuits coupled to said plurality of analog circuits.

5. The integrated x-ray detection system as claimed in claim 4, wherein said plurality of analog circuits comprise:
   a plurality of protection circuits respectively coupled to said plurality of anodes for receiving pulses from said plurality of anodes and for protecting electronic circuits downstream from said anodes;
   a plurality of amplifiers respectively coupled to said plurality of protection circuits for receiving said pulses and amplifying said pulses to yield amplified pulses; and
   a plurality of pulse shapers respectively coupled to said plurality of amplifiers for receiving said amplified pulses and outputting shaped pulses.

6. The integrated x-ray detection system as claimed in claim 5, wherein each of said respective plurality of digital circuits comprises:
   a plurality of multiple energy window circuits each of said multiple energy window circuits respectively coupled to said plurality of pulse shapers for receiving said shaped pulses and outputting digital logic pulses when said shaped pulses have amplitudes within an externally selected range; and
   a plurality of multiple digital counters respectively coupled to said plurality of multiple energy window circuits for receiving and counting said digital logic pulses.

7. The integrated x-ray detection system as claimed in claim 6, wherein each of said respective plurality of digital circuits further comprises:
   an internal digital I/O bus coupled to said plurality of multiple digital counters for receiving data from said plurality of multiple digital counters; and
   an I/O control logic device connected to said internal digital I/O bus for controlling said internal digital I/O bus.

8. The integrated x-ray detection system as claimed in claim 4, wherein each of said plurality of digital circuits comprises:
   a plurality of digital counters for, receiving and counting signals received from a respective one of said plurality of analog circuits.

9. The integrated x-ray detection system as claimed in claim 4, wherein each of said plurality of analog circuits comprises a plurality of energy window circuits and each of said plurality of energy window circuits converts shaped pulses to logic pulses when said shaped pulses are within a corresponding voltage range.

10. The integrated x-ray detection system as claimed in claim 1, further comprising a metal shield layer between said plurality of active signal processing circuits and said x-ray detectors for shielding said plurality of active signal processing circuits from electrostatic fields and electro-magnetic radiation.

11. The integrated x-ray detection system as claimed in claim 10, wherein said electrically isolating layer has a plurality of vias and said metal shield layer has a corresponding further plurality of via surrounds for electrically connecting said plurality of anodes of said x-ray detector to said plurality of active signal processing circuits.

12. The integrated x-ray detection system as claimed in claim 10, further comprising a metal back potential plane between said metal shield layer and said x-ray detector for holding a potential applied to said metal back potential plane during operation to establish a control electrostatic field.

13. The integrated x-ray detection system as claimed in claim 1, further comprising a cathode plane mounted to said housing.

14. The integrated x-ray detection system as claimed in claim 1, further comprising:

an electrical feedthrough connected to said housing having a plurality of pins with at least a respective one of said plurality of pins electrically connected to a plurality of electrically connected potential strips alternately arranged between pairs of said plurality of anodes on said wafer to maintain said plurality of electrically connected potential strips at a first applied potential;

a metal shield layer between said plurality of active signal processing circuits and said x-ray detector for shielding said plurality of active signal processing circuits from electrostatic fields and electromagnetic radiation, with at least a respective one of said plurality of pins electrically connected to said metal shield layer to maintain said metal shield layer at a second applied potential a metal back potential plane between said metal shield layer and said x-ray detector electrically connected to at least a respective one of said plurality of pins to maintain a third potential applied to said metal back potential plane during said x-ray detector operation to establish a control electrostatic field; and electrical contacts to electrically connect at least a respective one of said plurality of pins to power, threshold, signal, and ground electrical connections of said plurality of active signal processing circuits.

15. The integrated x-ray detection system as claimed in claim 1, wherein said housing has an x-ray transparent window for allowing passage of said x-ray photons.

16. The integrated x-ray detection system as claimed in claim 1, wherein said housing has at least one of a plurality of pins electrically connected to said plurality of active signal processing circuits for conducting said digital signal.

17. An integrated x-ray detection system, comprising:

a wafer capable of supporting integrated circuitry;

a housing for housing said wafer and a gas, wherein at least a portion of said housing passes x-ray photons which partially ionize said gas thereby producing at least one electron;

a plurality of anodes fabricated on said wafer, said plurality of anodes being maintained at a first potential;

a plurality of potential strips alternately arranged among said plurality of anodes on said wafer and maintained at a second potential;

a cathode plane arranged along said wafer and maintained at a third potential;

a back potential plane fabricated on said wafer and maintained at a fourth potential, wherein said first, second, third and fourth potentials are selected such that said at least one electron is accelerated toward one of said plurality of anodes with sufficient energy to produce a pulse at said one of said plurality of anodes;

a plurality of active signal processing circuits integrated into said wafer and respectively coupled to said plurality of anodes wherein a respective one of said plurality of signal processing circuits receives and processes said pulse to yield a digital signal indicating location of said one of said plurality of anodes and height of said pulse; and an insulating layer for separating said plurality of anodes, said plurality of potential strips and said back potential plane from said active signal processing circuit.

18. The integrated x-ray detection system as claimed in claim 17, wherein said plurality of anodes comprise a plurality of microstrip anodes.

19. The integrated x-ray detection system as claimed in claim 18, wherein said plurality of potential strips are respectively interposed between said plurality of microstrip anodes.

20. The integrated x-ray detection system as claimed in claim 17, wherein said plurality of active signal processing circuits comprises a respective plurality of analog circuits coupled to said plurality of anodes and a respective plurality of digital circuits coupled to said plurality of analog circuits.

21. The integrated x-ray detection system as claimed in claim 20, wherein said plurality of analog circuits comprise:

a plurality of protection circuits respectively coupled to said plurality of anodes for receiving pulses from said plurality of anodes and for protecting electronic circuits downstream from said anodes;

a plurality of amplifiers respectively coupled to said plurality of protection circuits for receiving said pulses and amplifying said pulses to yield amplified pulses;

a plurality of pulse shapers respectively coupled to said plurality of amplifiers for receiving said amplified pulses and outputting shaped pulses; and a plurality of groups of energy window circuits respectively coupled to said plurality of pulse shapers for converting said shaped pulses to logic pulses when said shaped pulses are within a corresponding voltage range.

22. The integrated x-ray detection system as claimed in claim 21, wherein each of said plurality of digital circuits comprises:

a plurality of digital counters respectively coupled to said plurality of energy window circuits for receiving and counting said logic pulses.

23. The integrated x-ray detection system as claimed in claim 22, wherein each of said respective plurality of digital circuits further comprises:

an internal digital I/o bus coupled to said plurality of digital counters for receiving data from said plurality of digital counters; and an I/O control logic device connected to said internal digital I/O bus for controlling said internal digital I/O bus.

24. The integrated x-ray detection system as claimed in claim 20, wherein each of said plurality of digital circuits comprises:

a plurality of digital counters for counting signals received from a respective one of said plurality of analog circuits.

25. The integrated x-ray detection system as claimed in claim 20, wherein each of said plurality of analog circuits comprises a plurality of energy window circuits and each of said plurality of energy window circuits converts shaped pulses to logic pulses when said shaped pulses are within a corresponding voltage range.

26. The integrated x-ray detection system as claimed in claim 17, wherein each of said plurality of active signal processing circuits comprises a plurality of amplifiers and a plurality of energy window circuits each having a corresponding voltage range, said plurality of energy window circuits being connected in parallel and each of said plurality of energy window circuits being coupled to each of said plurality of amplifiers for converting said pulse to a logic pulse when said pulse is within the corresponding voltage range.

27. The integrated x-ray detection system as claimed in claim 17, further comprising a metal shield layer between said plurality of active signal processing circuits and said plurality of anodes for shielding said plurality of active signal processing circuits from electrostatic fields and electro-magnetic radiation.

28. The integrated x-ray detection system as claimed in claim 27, wherein said insulation layer has a plurality of vias and said metal shield layer has a corresponding further plurality of via surrounds for electrically connecting said plurality of anodes to said plurality of active signal processing circuits.

29. The integrated x-ray detection system as claimed in claim 17, further comprising:

an electrical feedthrough connected to said housing having a plurality of pins with at least a respective one of said plurality of pins electrically connected to said plurality of electrically connected potential strips alternately arranged between pairs of said plurality of anodes on said wafer to maintain said plurality of electrically connected potential strips at a first applied potential;

a metal shield layer between said plurality of active signal processing circuits and said plurality of anodes for shielding said plurality of active signal processing circuits from electrostatic fields and electromagnetic radiation, with at least a respective one of said plurality of pins electrically connected to said metal shield layer to maintain said metal shield layer at a second applied potential;

wherein said back potential plane comprises a metal back potential plane between said metal shield layer and said plurality of anodes electrically connected to at least a respective one of said plurality of pins to maintain a third applied potential to said metal back potential plane during said x-ray detection system operation to establish a control electrostatic field; and electrical contacts to electrically connect at least a respective one of said plurality of pins to power, threshold, signal, and ground electrical connections of said plurality of active signal processing circuits.

30. The integrated x-ray detection system as claimed in claim 17, wherein said housing has an x-ray transparent window for allowing passage of said x-ray photons.

31. The integrated x-ray detection system as claimed in claim 17, wherein said housing has at least one of a plurality of pins electrically connected to said plurality of active signal processing circuits for conducting said digital signal.

* * * * *